United States Patent [19]

Hwang et al.

[11] Patent Number: 4,894,656

[45] Date of Patent: Jan. 16, 1990

[54] SELF-CALIBRATING PIPELINED SUBRANGING ANALOG-TO-DIGITAL CONVERTER

[75] Inventors: Jyh-Ping Hwang; Wen-Tai Lin, both of Schenectady; Miran Milkovic, Scotia; Sharbel E. Noujaim, Clifton Park, all of N.Y.

[73] Assignee: General Electric Company, Schenectady, N.Y.

[21] Appl. No.: 275,819

[22] Filed: Nov. 25, 1988

[51] Int. Cl.$^4$ .............................................. H03M 1/10
[52] U.S. Cl. ..................................... 341/120; 341/155
[58] Field of Search ............... 341/118, 122, 131, 155, 341/161, 120

[56] References Cited

U.S. PATENT DOCUMENTS

| | | | |
|---|---|---|---|
| 3,725,903 | 3/1973 | Kosakowski | 341/120 |
| 3,961,325 | 6/1976 | Kendall et al. | 341/120 |
| 4,222,107 | 9/1980 | Mrozowski et al. | 341/120 |
| 4,342,983 | 8/1982 | Weigand et al. | 341/120 |
| 4,371,868 | 2/1983 | Van de Grift et al. | 341/120 |
| 4,700,174 | 10/1987 | Sutherland et al. | 341/120 |

OTHER PUBLICATIONS

Lee et al., "A Self-Calibrating 15 Bit CMOS A/D Converter", IEEE J. of Solid-State Circuits, vol. SC-19, No. 6, pp. 813-819, Dec. 1984.
Dingwall et al., "An 8-MHz CMOS Subranging 8-Bit A/D Converter", IEEE J. of Solid-State Circuits, Dec. 1985, pp. 1138-1143.
Lewis et al., "A Pipelined 5-Msample/s 9-Bit Analog-to-Digital Converter", IEEE J. of Solid-State Circuits, Dec. 1987, pp. 954-961.
Takemoto et al., "A Fully Parallel 10-Bit A/D Converter with Video Speed", IEEE J. of Solid-State Circuits, Dec. 1982, pp. 1133-1138.

Primary Examiner—William M. Shoop, Jr.
Assistant Examiner—Helen Kim
Attorney, Agent, or Firm—Marvin Snyder; James C. Davis, Jr.

[57] ABSTRACT

An approach to A/D converter architecture is based on a "pipelined and submerged" architecture which includes a pipeline of elemental stages ($10_i$). Each stage of the pipeline comprises a low-resolution flash A/D subconverter (12), a D/A converter (14), and a unity-gain buffer (16). To minimize converter nonlinearity due to component mismatches, a self calibration technique based on an "interpolation" scheme is used. This technique employs an on-chip delta-sigma A/D converter (32) to provide the reference for calibration and a 100-bit memory (50) to store nonlinearity information. Long term drift is corrected by a calibrator (34) in parallel with data conversion.

10 Claims, 7 Drawing Sheets

SELF-CALIBRATING PIPELINED SUBRANGING ANALOG-TO-DIGITAL CONVERTER

BACKGROUND OF THE INVENTION

1. Field of the Invention

The present invention generally relates to analog-to-digital (A/D) converters and, more particularly, to a new architecture to realize fast, high resolution A/D converters in high-reliability VLSI monolithic semiconductor technology.

2. Description of the Prior Art

In many digital signal processing applications, it is necessary to accept signals that originate in the analog domain and to convert them to digital form prior to processing. As very large scale integrated (VLSI) circuit technology matures, digital signal processing is increasingly employed to address many low cost but high performance applications. It thus becomes crucial to implement analog/digital interface functions at low power, high precision and high reliability, either as discrete monolithic semiconductor devices or as on-chip macrocells for VLSI signal processors.

Many signal processing systems for military, industrial and nuclear applications require high-speed, high-resolution A/D converters in their front-end or input circuitry. These converters demand a high sensitivity and linearity of at least 12 bits at megaHertz (MHz) sampling rates. Present approaches to the realization of such converters depend on hybrid and discrete components that are bulky, cumbersome and expensive. More specifically, previous approaches to achieving high-speed, high-resolution monolithic A/D converters have used fully-parallel, two-step flash or pipelined architectures.

A fully parallel A/D converter architecture is described in an article entitled "A Fully Parallel 10 Bit A/D Converter with Video Speed: by Toyoki Takemoto, Michihiro Inoue, Hideaki Sadamatsu, Akira Matsuzawa, and Kazuhiko Tsuji in *IEEE Journal of Solid-State Circuits*, vol. SC-17, no. 6, pp. 1133 to 1138 (Dec. 1982). The fully parallel architecture described requires $2^m - 1$ comparators to achieve m bits of resolution.

A two-step flash A/D converter architecture is described in an article entitled "An 8 MHz CMOS Subranging 8-Bit A/D Converter" by Andrew G. F. Dingwall and Victor Zazzu in *IEEE Journal of Solid-State Circuits*, vol. SC-20, no. 6, pp. 1138 to 1143 (Dec. 1985). The two-step flash architecture described requires $2^{1+(m/2)} - 1$ comparators to achieve m bits of resolution.

In both the fully parallel and two-step flash architectures, the large number of required comparators as well as their associated peripheral circuits result in large die sizes along with significant input loading and power dissipation, making their extension to high resolution (more than 10 bits) difficult or impractical. A pipelined architecture is described in "A Pipelined 5-M sample/s 9-bit Analog-to-Digital Converter" by Stephen H. Lewis and Paul R. Gray in *IEEE Journal of Solio-State Circuits*. vol. SC-22, no. 6, pp. 954 to 961 (Dec. 1987). The pipelined architecture does not suffer from large die sizes; however, the stringent requirement of inter-stage differential amplifiers for analog subtraction and amplification tends to limit its speed and accuracy, particularly when implemented in bulk complementary metal-oxide-semiconductor (CMOS) switched capacitor circuitry. These limitations have generally held previous approaches for achieving improved A/D converters to a maximum resolution of ten bits or less at 5 to 10 MHz sampling rates.

Translating these approaches to monolithic implementation requires innovative analog switched capacitor circuitry as well as efficient self-calibration techniques. Presently, these desirable items are being actively pursued by various industrial and university researchers; however, there remains a need for facile implementation of monolithic A/D converters with more than 12-bit resolution at higher than 10 MHz sampling rates.

SUMMARY OF THE INVENTION

It is therefore an object of the present invention to provide a generic architecture and a self-calibration technique for implementing high-speed, high-resolution analog-to-digital converters.

It is a further object of the invention to provide an architecture for high-speed, high-resolution analog-to-digital converters in which a throughput rate of one sample per clock cycle is achieved without exponentially increasing hardware and without interstage analog amplification.

According to the invention, a self-calibrating pipelined subranging analog-to-digital converter comprises sample-and-hold means for sampling an analog signal which is to be converted to a digital output code, and a pipeline of elemental stages connected for sampling the analog signal to generate a low-resolution output digital code. Calibration means are provided and include memory and arithmetic means addressed by the low-resolution output digital code for storing nonlinearity information and computing a second output digital code based on an interpolation of the low-resolution output digital code with the nonlinearity information. A high-resolution analog-to-digital converter is connected to the sample-and-hold means and, in response to samples of the analog signal, generates a high-resolution output digital code which serves as a reference. The calibration means is periodically responsive to the high resolution output digital code for calibrating the memory and arithmetic means.

BRIEF DESCRIPTION OF THE DRAWINGS

The foregoing and other objects, aspects and advantages of the invention will be better understood from the following detailed description of a preferred embodiment of the invention with reference to the drawings, in which.

DETAILED DESCRIPTION OF A PREFERRED EMBODIMENT OF THE INVENTION

Figure 1:
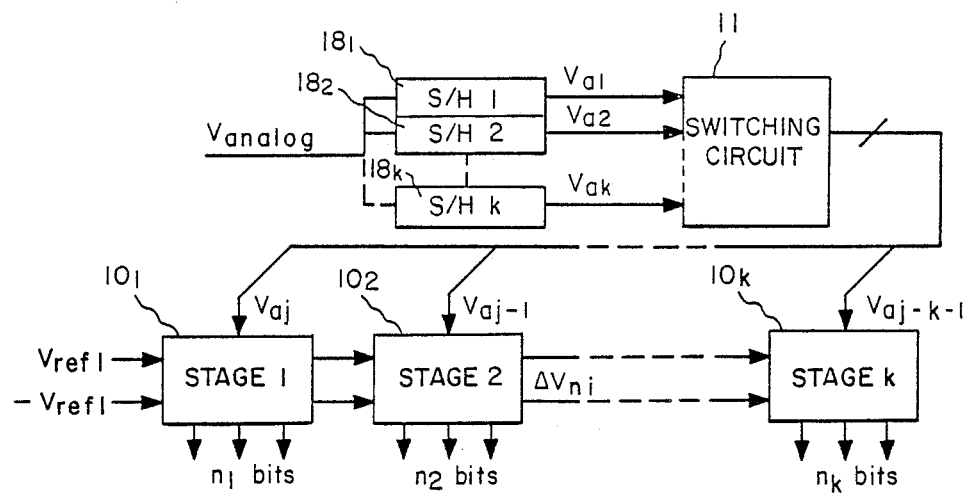
FIG. 1 is a high level block diagram showing the basic architecture of a pipelined subranging A/D converter according to the invention.
Figure 2:
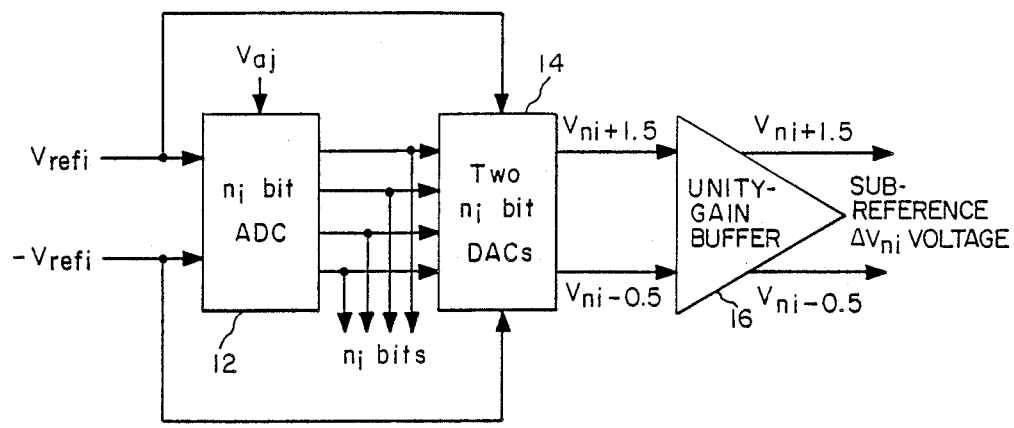
FIG. 2 is a block diagram generally showing the structure of a stage in the A/D converter shown in FIG. 1.

In FIGS. 1 and 2, which show the architecture of a pipelined subranging A/D converter in accordance with the invention, the converter is shown to be made up of a clocked pipeline of elemental stages. Each stage $10_1, 10_2, \ldots, 10_k$ of the pipeline is comprised, as shown in FIG. 2, of a low-resolution $n_i$-bit flash A/D subconverter 12, two $n_i$-bit digital-to-analog (D/A) converters 14, and a unity-gain buffer 16. The analog input signal for each respective stage of the pipelined A/D converter is sampled successively through a plurality of sample-and-hold (S/H) circuits $18_1, 18_2, \ldots, 18_k$, and each S/H circuit delivers its held signal $V_{a1}, V_{a2} \ldots V_{ak}$, respectively, as voltages $V_{aj}, V_{aj-1} \ldots V_{aj-k-1}$, respectively, to each of the pipeline stages sequentially through a switching circuit 11 such as a continually-clocked shift register. The pipeline stages, sample-and-hold circuits, and switching circuit are all driven in common by a clock (not shown, for simplicity of illustration). With each clock cycle, the held voltage in each sample-and-hold circuit is supplied to the next successive pipeline stage, and the sample-and-hold circuit that had been coupled to the final stage $10_k$ of the pipelined A/D converter takes a new sample of the analog input voltage $V_{analog}$ which is held and supplied to the first stage $10_1$ of the pipelined A/D converter.

The analog input signal $V_{aj}$ of each stage of the pipelined A/D converter is converted by the A/D subconverter 12 of that stage to $n_i$ bits. The A/D subconverter receives its reference voltages and ($V_{refi}$ and $-V_{refi}$) from the immediately preceding stage of the pipelined A/D converter. The $n_i$ bits are sent to the D/A converters 14 which generate the corresponding sub-reference voltages ($V_{ni+1.5}$ and $V_{ni-0.5}$). These voltages are then delivered as voltages $V_{ni+1.5}$ and $V_{ni-0.5}$ to the next following stage as its reference voltages through unity-gain buffer 16. It will be appreciated that the subscript i, as used in conjunction with a voltage, signifies input voltages to any stage as being received from the immediately preceding stage and output voltages from any stage being applied to the next successive stage, while the subscript j signifies the sampled analog voltage supplied to any given one (j) of the pipelined A/D converter stages by a corresponding one of the sample-and-hold circuits.

Depending upon the resolution, speed and cost requirements, the A/D subconverter 12 in each of the pipeline stages can in principle be implemented by any known A/D converter scheme, such as flash, successive-approximation, oversampled delta-sigma, etc. Similar consideration applies to the D/A converters 14 in each of the pipeline stages.

Figure 3:
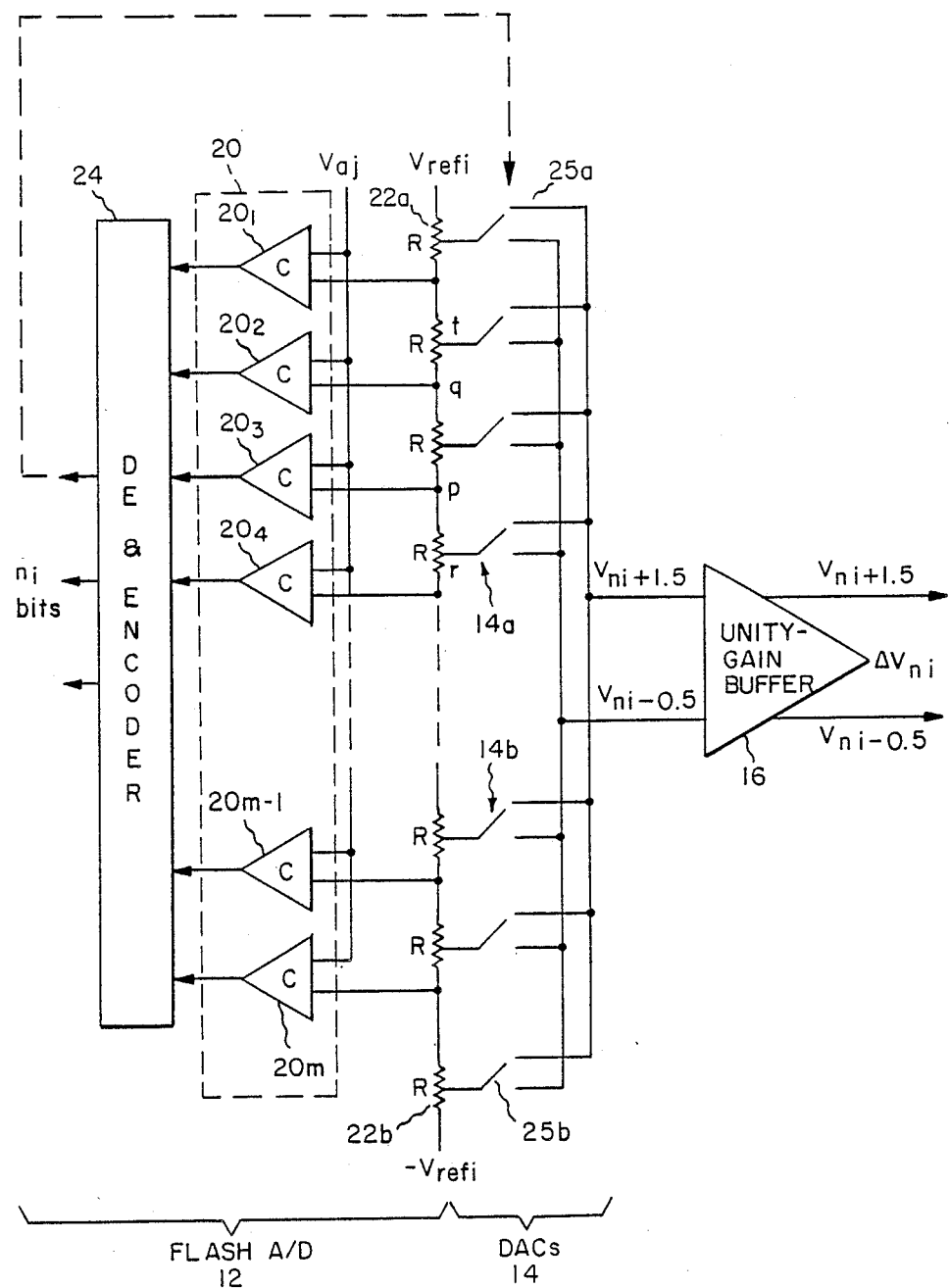
FIG. 3 is a part block and part schematic diagram showing in more detail the structure of the A/D converter stage shown in 2.

FIG. 3 is a more detailed example of one stage of a high-speed pipelined A/D converter where a flash A/D subconverter 12 and two resistive D/A converters 14a and 14b are employed. In this example the analog input voltage $V_{aj}$ of the stage drives $2^{ni-1}$ comparators $20_1, 20_2 \ldots, 20_m$, where $m=2^{ni-1}$, whose reference voltages are tapped from resistor strings 22a and 22b of D/A converters 14a and 14b, respectively. The amplified difference signal between the analog input voltage and the reference voltage of each comparator is squared up and latched to produce a logic level. A decoder and encoder 24, such as the interconnected decoder and encoder shown and described in S. T. Chu et al. U.S. Pat. No. 4,768,016, issued Aug. 20, 1988 and assigned to the instant assignee, interprets the comparator outputs and selects the appropriate code from the encoder portion to produce a conversion result with $n_i$ bits of resolution. The resulting conversion signal is supplied to the switch networks 25a and 25b of the respective D/A converters 14a and 14b to select the corresponding reference voltage range (or "subrange") and deliver it to the next pipeline stage through unity-gain buffer 16. The corresponding subreference voltage difference $\Delta V_{ni} = V_{ni+1.5} - V_{ni-0.5}$ is thus applied to the following stage as its reference voltage across the resistor string. This "subrange" then defines the conversion range for the following stage while the current stage encodes the next sample, and the process repeats until the end of the pipeline. It should be understood that while switch networks 25a and 25b are represented as being made up of mechanical switches for ease of understanding, the switches are actually implemented electronically in a manner well known to those skilled in the art.

To remedy the fact that comparators may have offsets large compared to $\frac{1}{2}$LSB (least significant bit), thus accidentally selecting the wrong "subrange", the voltage window for the following stage is doubled to tolerate and correct errors. For instance, when a given analog input signal falls into the voltage range between taps p and q on the resistors R of resistor string 22a shown in FIG. 3, the switch network 25a will select and deliver the voltage window between taps r and t to the following stage. In this way, the following stage will generate an extra bit which can be used to correct the digital error of the previous stage. This "double-window" scheme relaxes the stringent requirements that necessitate use of high-precision comparators and the unity-gain buffers are allowed to have offsets large compared to $\frac{1}{2}$LSB. The comparators in the last stage require the highest resolution since the subrange in the last stage is the narrowest among all the pipeline stages. To relax this stringent resolution requirement, the last stage is modified such that the residual voltage from the previous stage is amplified and delivered to the last stage as its analog input signal. In this way, a coarse amplifier with $n_k$ bits of accuracy and the relaxed comparators with $\frac{1}{2} \cdot 2^{nk}$·LSB of resolution will satisfy the performance requirements.

The accuracy of the entire converter depends mainly on the accuracy of the first stage sub-reference voltage $\Delta V_{n1} = V_{n1+1.5} - V_{n1-1.5}$ which is determined by the absolute accuracies of the D/A converters 14 and the unity-gain buffer 16. For m-bit resolution, the sub-reference voltage from the first stage must be accurate to m-bit level; any deviation from this will affect the integral linearity of the converter. The sub-reference voltages from the subsequent stages, however, are only required to be accurate to the $$\left( m - \sum_{i=1}^{h-1} n_i \right)$$

bit level, where h is the order of the pipeline stage of interest. For a typical monolithic VLSI technology, a reference resistor string with more than 9 to 10 bits of accuracy is very difficult to realize. To avoid this, a capacitive D/A converter array based on charge redistribution can be employed in the first pipeline stage in order to achieve the required accuracy.

The pipelining and concurrency features of the pipelined subranging architecture result in high throughput of the converter. At any time, the first stage is converting the most recent sample ($V_{aj}$) with a full voltage range, the next stage is converting the previous sample ($V_{aj-1}$) with a "subrange" generated from the previous stage, and the next stage is converting the sample previous to that ($V_{aj-2}$), and so forth. This pipelining scheme achieves a throughput rate at one sample per clock cycle, the same as that in the pure flash converter. However, each stage of the pipeline can have relatively low resolution, making the associated hardware complexity relatively low compared to a pure flash or two-step flash converter. On the other hand, the pipelined subranging architecture does not require analog processing (i.e., subtraction and amplification) as in the conventional pipelined approach. Any concern about encountering unknown offset and gain errors that plague the conventional pipelined architecture due to analog processing can thus be relieved.

Figure 4C:
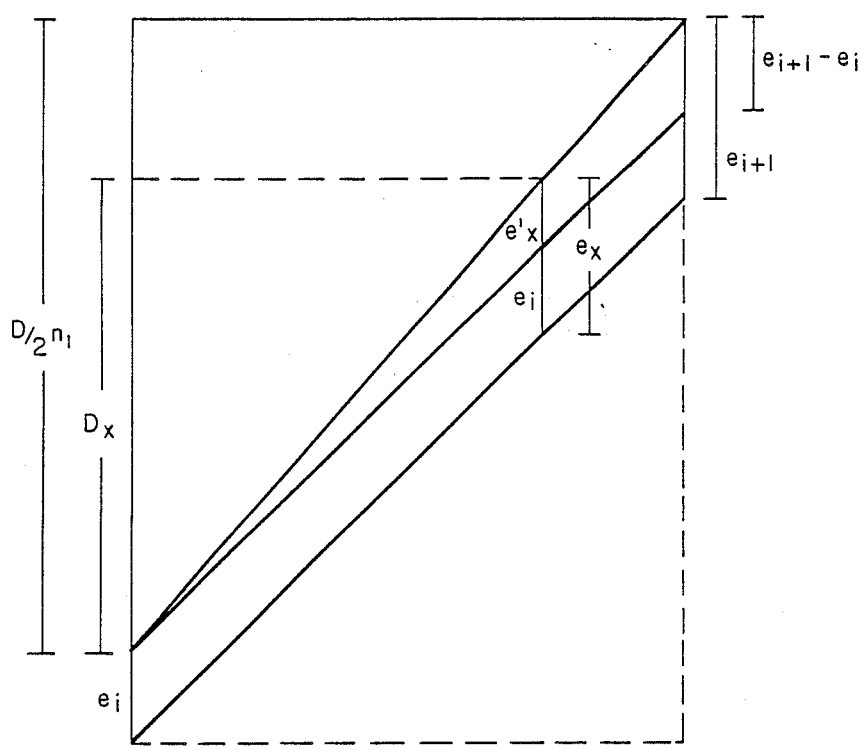
FIG. 4C is a graph showing the linearity error $e_x$ at any given output code computed using an interpolation method according to the invention.
Figure 4A:
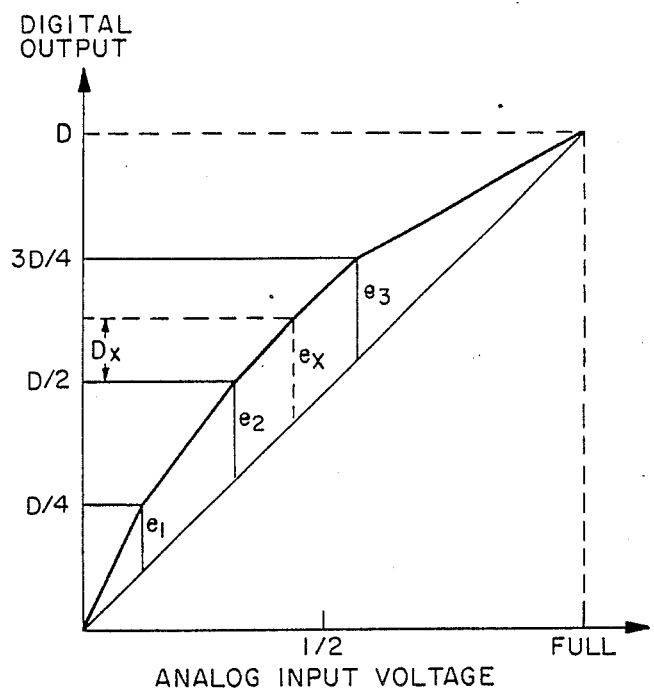
FIG. 4A is a graph showing the transfer characteristic of an A/D converter with integral nonlinearity.
Figure 4B:
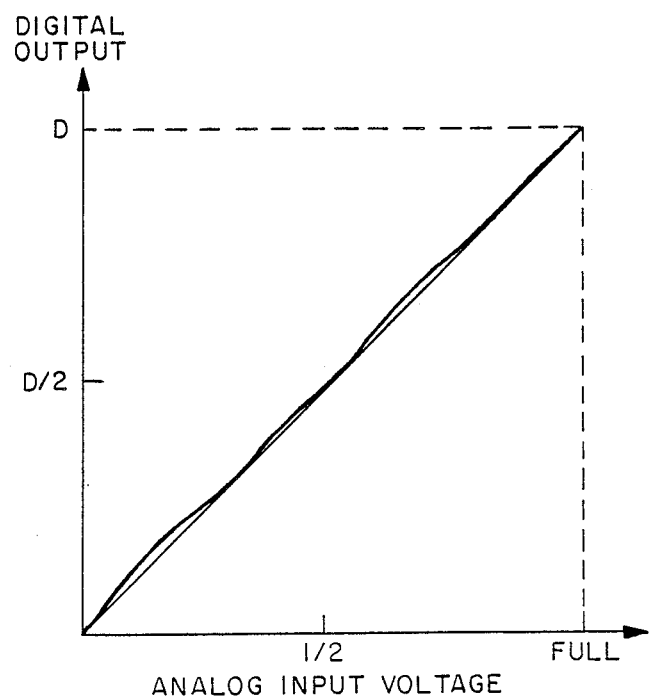
FIG. 4B is a graph showing the transfer characteristic of FIG. 4A after four-section calibration.

An A/D converter transfer characteristic with an exaggerated integral nonlinearity due to resistor as well as other subtle component mismatch is shown in FIG. 4A. Intuitively, it would seem possible to store the linearity error with respect to each output code in a random access memory (RAM) and use table lookup to correct the error. However, due to the large memory capacity required, this approach may not be attractive in monolithic implementation. An "interpolation" scheme would be simpler and much more area-efficient. The non-ideal transfer characteristic of the converter can be approximated by a piecewise-linear curve as shown in FIG. 4A, where a four-segment linear approximation is indicated. The linearity errors ($e_1$, $e_2$ and $e_3$) at each turning point of the curve can be detected and stored in the RAM. To calibrate the piecewise-linear turning point of the curve of FIG. 4A, the gain should be adjusted for the first section of the curve, and both the gain and offset should be adjusted for the remaining sections. After four-segment piecewise-linear calibration, the transfer characteristic of the converter can be improved to that shown in FIG. 4B, where the linearity errors at the one-quarter, one-half and three-quarter points of the transfer curve are eliminated.

The non-ideal transfer characteristic can be calibrated more accurately with more section approximation. For a pipelined subranging converter, it is appropriate to use $2^{n_1}$-segment linear approximation, where $n_1$ is the number of bits of resolution of the first pipeline stage. In this way, the nonlinearity due to any mismatched resistor element in the first stage can be calibrated. The linearity error ($e_x$) at any given output code can be computed by using the interpolation method as shown in FIG. 4C. The linearity error ($e_x$) consists of offset error ($e_i$) and gain error ($e_x'$); i.e., $e_x = e_i + e_x'$. It can be easily shown that the general relation between the gain error ($e_x'$) and the adjacent offset difference ($e_{i+1} - e_i$) is $$\frac{e_x'}{e_{i+1} - e_i} = \frac{D_x}{D/2^{n_1}}$$

where $D_x$ and D stand for the given digital output signal and the full digital output range, respectively. Therefore, $$e_x = e_i + (e_{i+1} - e_i)\left(\frac{D_x}{D/2^{n_1}}\right) \quad (1)$$

Since $d = 2^m$, where m is the resolution of the pipelined subranging converter, and $$D_x = \sum_{j=1}^{m-n_1} 2^{j-1} d_j,$$

where $d_j$ represents the value (1 or 0) of any bit of the digital code produced by any pipelined A/D converter stage, equation (1) can be expressed in the following digital form, $$e_x = e_i + (e_{i+1} - e_i)\left(\sum_{j=1}^{m-n_1} d_j 2^{j-1-m+n_1}\right) \quad (2)$$

This computation can be performed in the digital circuitry using shift registers and binary tree adders.

Figure 5:
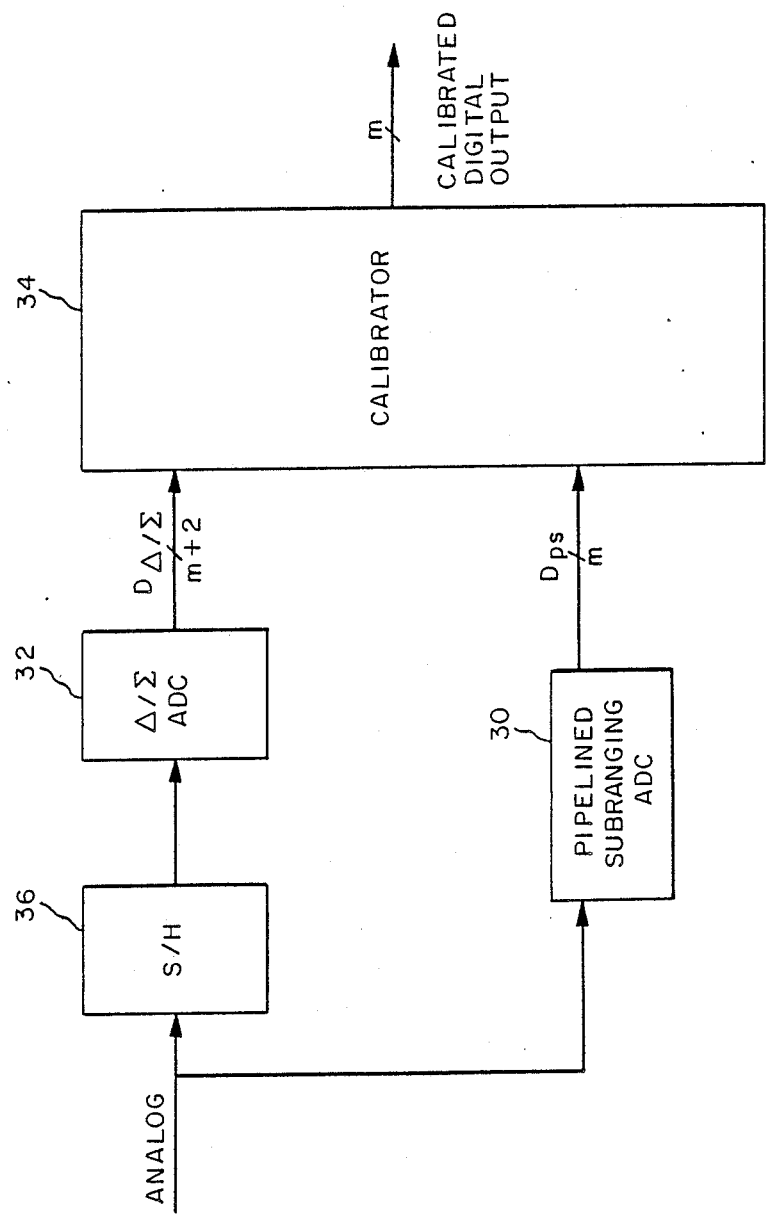
FIG. 5 is a block diagram of the self-calibrating A/D converter system of the invention.

A block diagram of the monolithic A/D converter system that implements the above calibration algorithm is shown in FIG. 5. The system comprises a pipelined subranging A/D converter 30 (of the type shown in FIG. 1) to be calibrated, a high-precision but low speed A/D converter 32 such as an over-sampled delta-sigma converter, and a calibrator 34. An analog signal entering the system is delivered in parallel to the two converters. A sample-and-hold (S/H) circuit 36 samples the analog signal for the delta-sigma converter 32. The delta-sigma converter 32 has two more bits of resolution than the pipelined subranging converter 30 and provides an ideal transfer characteristic for calibration. There are two operating modes in the system; an error detection mode and the normal conversion mode. In the error detection mode, the pipelined subranging A/D converter 30 output signal comprised of certain samples is compared with the delta-sigma converter 32 output signal and the difference is detected and stored in a random access memory (RAM) portion of calibrator 34. In the normal conversion mode, the pipelined subranging A/D converter 30 output signal accesses the stored information to compute its corresponding linearity error ($e_x$) and to cancel its nonlinearity.

Figure 6:
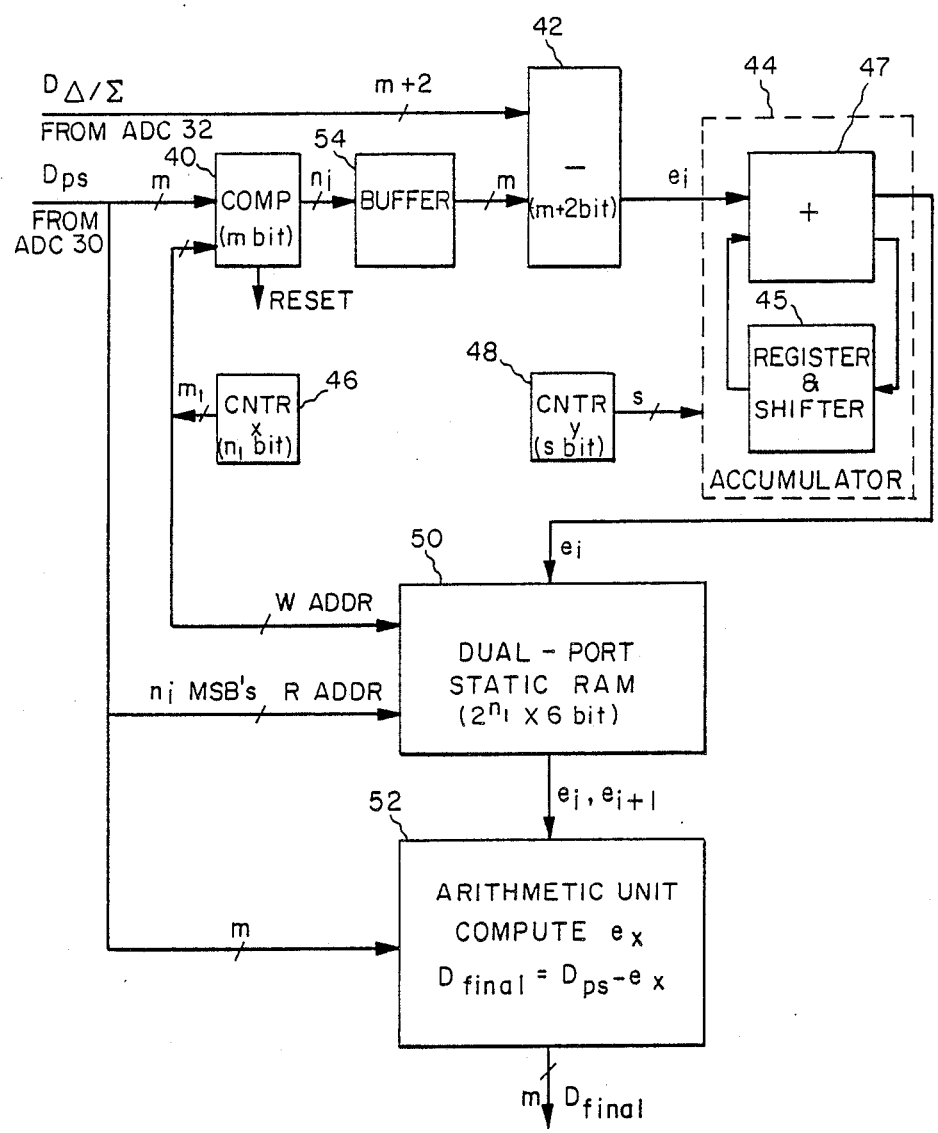
FIG. 6 block diagram of the calibrator used in the system shown in FIG. 5.
Figure 7:
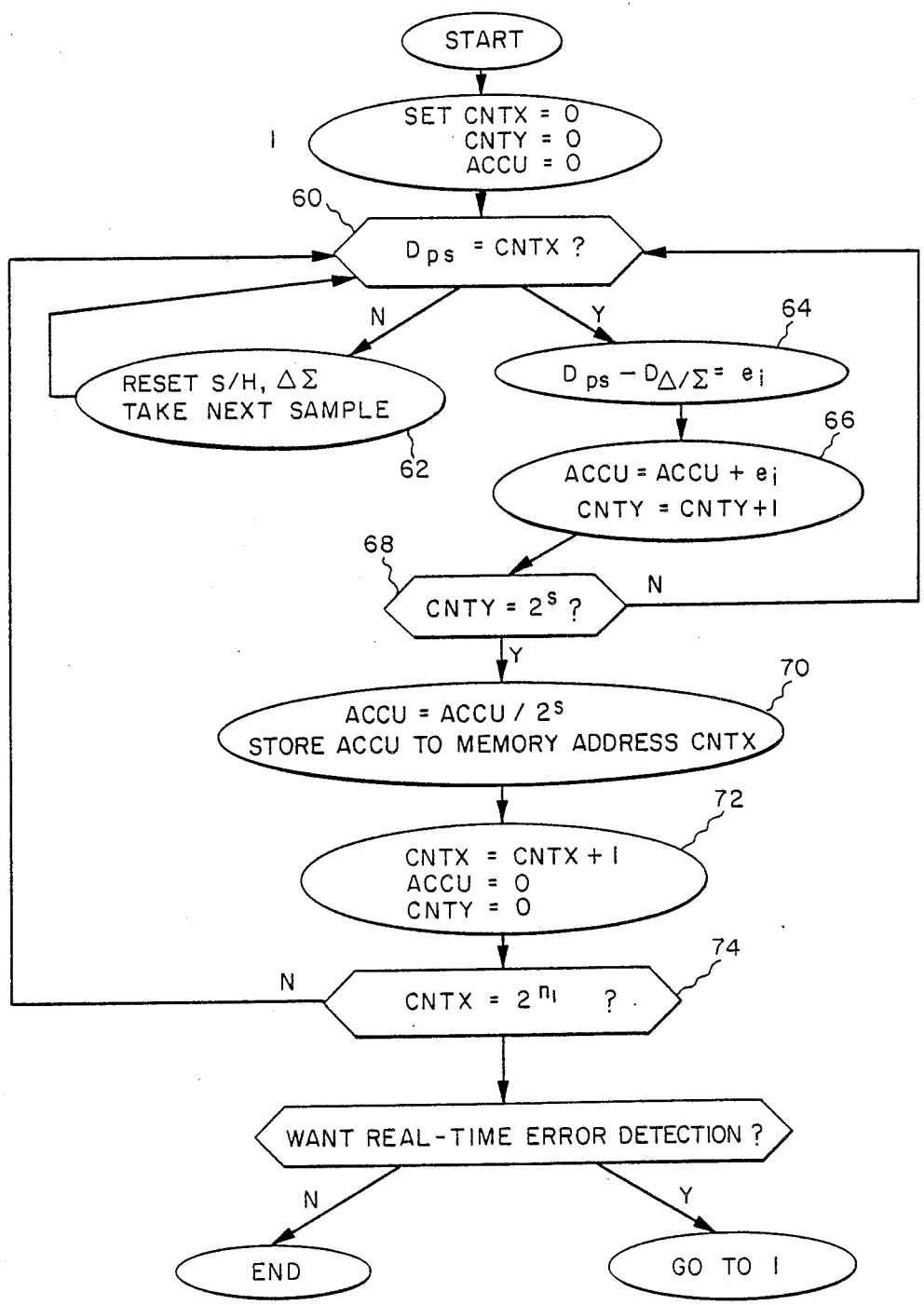
FIG. 7 is a flow chart showing the logic for the error detection sequence employed in the calibrator shown in FIG. 6.

FIG. 6 is a block diagram of the calibrator 34 of FIG. 5, and FIG. 7 is a flow diagram illustrating the basic sequence of error detection in the calibrator. The calibrator comprises an m-bit comparator 40, an (m+2)-bit subtractor 42 having one input coupled to the output of comparator 40 through a buffer 54 and a second input receiving the digital output signal ($D_{66-\Sigma}$) from slow delta-sigma A/D converter 32 (shown in FIG. 5). The output of an $n_1$-bit counter 46, which counts a number designated x, is coupled to one input of comparator 40 and to the W ADDR (or Write Address) port of a dual-port static random access memory (RAM) 50. The output of an s-bit counter 48, which counts a number designated y, is coupled to one input of an accumulator 44 having a second input coupled to the output of subtractor 42. The accumulator comprises a shift register 45 and an adder 47, the output of each being coupled to the input of the other, respectively. The digital output signal ($D_{ps}$) from the pipelined subranging A/D converter 30 (shown in FIG. 5) is supplied to a second input of comparator 40, the second port designated R ADDR (or Read Address) of dual-port static RAM 50, and to a first input of an arithmetic unit 52 that computes $e_x$ according to equation (2). The arithmetic unit receives, as a second input, the output signal of dual-port static RAM 50.

The error detection mode begins by comparing the digital output signal $D_{ps}$ from the pipelined subranging A/D converter 30 with the output signal of counter 46. When the most significant $n_1$ bits of signal $D_{ps}$ are equal to the output of counter 46 and the remaining least significant $(m - n_1)$ bits are all equal to 0, signal is delivered to the buffer 54, as indicated by the test in decision block 60 of FIG. 7. Otherwise, a reset signal is generated to reset the sample-and-hold circuit 36 (shown in FIG. 5) as well as delta-sigma converter 32 (FIG. 5) to take and convert the next sample, as indicated by function block 62. Digital signal $D_{ps}$ stays in the buffer 54 until the slow delta-sigma converter 32 produces a high precision digital value $D_{66-\Sigma}$ corresponding to the sample being held. The linearity error $(e_i)$ with respect to signal $D_{ps}$ is determined by subtracting $D\Delta - \Sigma$ from $D_{ps}$ in subtractor 42, as indicated in function block 64.

To average and eliminate the effect of random noise, offset error $e_i$ corresponding to a given digital signal $D_{ps}$ is detected several times before being stored in RAM 50. This is accomplished by temporarily storing the offset error $e_i$ in accumulator 44, as indicated in function block 66, and repeating the error detection sequence $2^s$ times, as determined by the test presented in decision block 68. Counter 48 counts the number of occurrences of offset error $e_i$ detection. Once the output count of counter 48 reaches $2^s$, the accumulated result is divided by $2^s$ in shift register 45 of the accumulator to produce an averaged offset error $e_i$, as indicated by function block 70. This averaged offset error $e_i$ is then stored in RAM 50 at the address equal to the output count of counter 46.

Counter 48 counts much faster than counter 46. Counter 48 counts to $2^s$, where s is an arbitrary number defined by the user to average the error. Typically, s might be set equal to 5. Counter 46 counts to $2^{n_1}$, where $n_1$ is the resolution of the first pipeline stage. In an implemented prototype of the system, $n_1$ was set to equal 4.

The error detection process continues by incrementing counter 46, as indicated in function block 72, and detecting the linearity error with respect to the next bit pattern constructed by $n_1$ most significant bits (MSBs) of digital signal $D_{ps}$, as determined according to the test presented in decision block 74. When the output signal of counter 46 reaches $2^{n_1}$, the linearity errors with respect to all of the turning points of a $2^{n_1}$-segment piecewise-linear approximated transfer curve have been detected and stored in RAM 50.

During subsequent normal conversion mode, the most significant $n_1$ bits of pipelined subranging A/D converter 30 output signal access its corresponding nonlinearity terms $(e_i, e_{i+1})$ from RAM 50. These terms are delivered to the arithmetic unit to compute its corresponding linear error $(e_x)$ according to equation (2). This linearity error $(e_x)$ is then subtracted from the pipelined subranging A/D converter output signal $D_{ps}$ to cancel its nonlinearity.

The error detection mode can be performed concurrently with normal conversion mode to frequently update the error terms $(e_i)$ stored in RAM 50. Any long term drift of components due to temperature or environment variations can be detected and corrected.

While the invention has been described in terms of a single preferred embodiment, those skilled in the art will recognize that the invention can be practiced with modification within the spirit and scope of the appended claim.

Having thus described our invention, what we claim as new and desire to secure by Letters Patent is as follow:

1. A self-calibrating pipelined subranging analog-to-digital converter comprising:
   sample-and-hold means for sampling an analog signal to be converted to a output digital code;
   a pipeline of elemental stages connected for sampling said analog signal to generate a low-resolution output digital code;
   calibration means including memory and arithmetic means addressed by said low-resolution output digital code for storing nonlinearity information and computing a second output digital code based on an interpolation of said low-resolution output digital code with said nonlinearity information; and
   a high-resolution analog-to-digital converter connected to said sample-and-hold means and responsive to samples of said analog signal to generate a high-resolution output digital code, said high resolution output digital code serving as a reference, said calibration means being periodically responsive to said high resolution output digital code for calibrating said memory and arithmetic means.

2. The self-calibrating pipelined subranging analog-to-digital converter of claim 1 wherein said high-resolution analog-to-digital converter comprises a delta-sigma converter.

3. The self-calibrating pipelined subranging analog-to-digital converter of claim 1 wherein each respective stage of said pipeline comprises:
   a low-resolution flash analog-to-digital subconverter generating a portion of said low-resolution output digital code;
   digital-to-analog converter means responsive to said analog-to-digital subconverter for producing a subrange output voltage for the stage; and
   buffer means for supplying said subrange output voltage to a successive stage of the pipeline.

4. The self-calibrating pipelined subranging analog-to-digital converter of claim 3 wherein said digital-to-analog converter means comprises a switch network means controlled by said portion of said low-resolution output digital code.

5. The self-calibrating pipelined subranging analog-to-digital converter of claim 4 wherein said buffer means exhibits unity gain.

6. The self-calibrating pipelined subranging analog-to-digital converter recited in claim 5 wherein said switch network means includes a resistive network and a plurality of switches, each of said switches, respectively, being connected to a junction, respectively, in said resistive network for selectively connecting a first one of the junctions to said unity-gain buffer means and a second one of said junctions to said unity-gain buffer means, such that a voltage drop between said first and second junctions constitutes said subrange voltage.

7. The self-calibrating pipelined subranging analog-to-digital converter of claim 6 wherein said flash analog-to-digital subconverter comprises decoder and encoder means for controlling the positions of said switches, and a plurality of comparator means for providing input signals to said decoder and encoder means, each of said comparator means having a first input responsive to said samples of said analog signal, and a second input respectively connected to an additional junction, respectively, in said resistive network.

8. The self-calibrating pipelined subranging analog-to-digital converter of claim 1 wherein each respective stage of said pipeline comprises:

a low-resolution successive-approximation analog-to-digital subconverter generating a portion of said low-resolution output digital code;

means controlled by said portion of said low resolution output digital code for producing a subrange output voltage for the stage; and buffer means for supplying said subrange output voltage to a successive stage of the pipeline.

9. The self-calibrating pipelined subranging analog-to-digital converter of claim 1 wherein each respective stage of said pipeline comprises:

a low-resolution oversampled delta-sigma analog-to-digital subconverter generating a portion of said low-resolution output digital code;

means controlled by said portion of said low-resolution output digital code for producing a subrange output voltage for the stage; and buffer means connecting said subrange voltage output to a successive stage of the pipeline.

10. The self-calibrating pipelined subranging analog-to-digital converter of claim 1 wherein said calibration means further comprises:

first and second counter means, said first counter means counting a first $n_1$-bit number x and said second counter means counting a second s-bit number y;

comparator means for comparing said low-resolution output digital code with said number x and when the most significant $n_1$ *bits of said low-resolution output digital code are equal to an output count of said first counter, producing said low-resolution output digital code; and* computation means responsive to said second counter means for repetitively subtracting said highresolution output digital code from the low-resolution output digital code of said comparator means and accumulating a difference output and, when said number y reaches $2^s$, dividing the accumulated difference by $2^s$ to produce an averaged linearity error, said averaged linearity error being stored in said memory and arithmetic means as said nonlinearity information.

* * * * *